United States Patent
Muterspaugh et al.

(10) Patent No.: US 9,661,791 B2
(45) Date of Patent: May 23, 2017

(54) RF INTERFERENCE SUPPRESSOR

(75) Inventors: Max Ward Muterspaugh, Westfield, IN (US); William John Testin, Indianapolis, IN (US); Darin Bradley Ritter, Indianapolis, IN (US); Mickey Jay Hunt, Camby, IN (US)

(73) Assignee: THOMSON Licensing DTV, Issy les Moulineaux (FR)

( * ) Notice: Subject to any disclaimer, the term of this patent is extended or adjusted under 35 U.S.C. 154(b) by 404 days.

(21) Appl. No.: 13/522,502

(22) PCT Filed: Jan. 20, 2011

(86) PCT No.: PCT/US2011/000105
§ 371 (c)(1),
(2), (4) Date: Jul. 17, 2012

(87) PCT Pub. No.: WO2011/090788
PCT Pub. Date: Jul. 28, 2011

(65) Prior Publication Data
US 2012/0287588 A1    Nov. 15, 2012

Related U.S. Application Data

(60) Provisional application No. 61/336,351, filed on Jan. 21, 2010.

(51) Int. Cl.
H05K 9/00    (2006.01)
(52) U.S. Cl.
CPC .................. *H05K 9/006* (2013.01)

(58) Field of Classification Search
CPC ................ H05K 9/006; H01R 13/6586; H01R 13/6587; H01R 13/6588; H01R 13/659; H01R 13/6594; H01R 13/6582
(Continued)

(56) References Cited

U.S. PATENT DOCUMENTS 3,907,396 A    9/1975 Huber
4,628,412 A  * 12/1986 Nigorikawa .................. 361/816
(Continued)

FOREIGN PATENT DOCUMENTS

CN    1659787       8/2005
EP    1598944 A1   11/2005
(Continued)

OTHER PUBLICATIONS

Search Report Dated: Jun. 21, 2011.

*Primary Examiner* — Tuan T Dinh
*Assistant Examiner* — Mukund G Patel
(74) *Attorney, Agent, or Firm* — Brian J. Dorini; Patricia A. Verlangieri

(57) ABSTRACT

An RF interference suppressor for satellite receivers and more specifically those that employ the MOCA standard is provided. The RF interference suppressor shields the connection point of the center conductor of the F-connector to the PC board from spurious signals emanating from the high speed digital portions of the receiver. In addition, the RF interference suppressor shield includes a tab portion that encompasses the threaded portion of the F-connector and operates to shield the path for RF interference resulting from the gap between the F-connector body and the inner shield wall of the receiver.

15 Claims, 5 Drawing Sheets

(58) Field of Classification Search
USPC .................. 361/752, 800, 816, 818; 174/388
See application file for complete search history.

(56) References Cited

U.S. PATENT DOCUMENTS

| | | | |
|---|---|---|---|
| 4,736,266 | A | 4/1988 | Tanibe |
| 6,407,932 | B1 * | 6/2002 | Gaio et al. .................... 361/818 |
| 7,118,381 | B2 | 10/2006 | Weidner |
| 7,384,306 | B2 | 6/2008 | Malstrom et al. |
| 7,466,564 | B2 * | 12/2008 | Harada et al. ................ 361/814 |
| 2002/0135445 | A1 * | 9/2002 | Onishi ............................ 334/85 |
| 2004/0246687 | A1 * | 12/2004 | Abe et al. ..................... 361/752 |
| 2006/0041919 | A1 | 2/2006 | Tokunaga et al. |
| 2008/0077968 | A1 | 3/2008 | Okami |
| 2009/0298329 | A1 | 12/2009 | Yamamoto |

FOREIGN PATENT DOCUMENTS

| | | |
|---|---|---|
| EP | 1740028 A1 | 1/2007 |
| GB | 2270206 A | 3/1994 |
| JP | 0897584 | 4/1996 |
| JP | 10209669 | 8/1998 |
| JP | 11231974 | 8/1999 |
| JP | 2008-10595 A | 1/2008 |
| JP | 2009290085 | 12/2009 |

* cited by examiner

RF INTERFERENCE SUPPRESSOR

CROSS REFERENCE TO RELATED APPLICATIONS

This application claims the benefit, under 35 U.S.C. §365 of International Application PCT/US2011/000105, filed Jan. 20, 2011, which was published in accordance with PCT Article 21(2) on Jul. 28, 2011 in English and which claims the benefit of U.S. provisional patent application No. 61/336,351, filed Jan. 21, 2010.

TECHNICAL FIELD

The present principles relate to satellite receivers. More particularly, it relates to an RF interference suppressor for satellite receivers.

BACKGROUND

In previous satellite receivers, a down-converted signal in the frequency band from 950 to 2150 MHz was sent from an outdoor antenna and converter to one or more receivers in a consumer's residence by means of a coaxial cable. This required some protection from outside interfering signals, but not of a high degree. Some systems also employed a "B band" from 250 to 750 MHz, but all of these signals received a great deal of amplification in the outdoor unit such that ingress into the coaxial cable and/or receiver was controlled to a satisfactory level by normal suppression and shielding techniques.

A need now exists for a new satellite receiver employing a special communication channel having unique and very good suppression capabilities of undesired RF energies for high volume applications. Previous satellite receivers do not have a secondary communications channel and therefore, do not require the higher degree of suppression.

SUMMARY

According to an implementation, the RF interference suppressor for a satellite receiver includes a metal shield configured to be mounted on the underside of the printed circuit board of the satellite receiver so as to enclose a point of connection of a center connector of the at least one F-connector to the PC board. The RF interference suppressor further includes a bottom, three sides extending transversely from the bottom, and a tab extending upward from the bottom and having an aperture configured to fit around a threaded portion of the at least one F-connector, the tab portion being separated from the three sides;

According to another implementation, the RF interference suppressor for a satellite receiver includes a metal shield configured to be mounted on the underside of the printed circuit board of the satellite receiver so as to enclose each point of connection of a center connector of each of the more than one F-connector to the PC board. The RF interference suppressor further includes a bottom, three sides extending transversely from the bottom, a tab extending upward from the bottom and having more than one aperture each configured to fit around a threaded portion of each one of the more than one F-connectors, the tab portion being separated from the three sides.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which.

DETAILED DESCRIPTION

Figure 1:
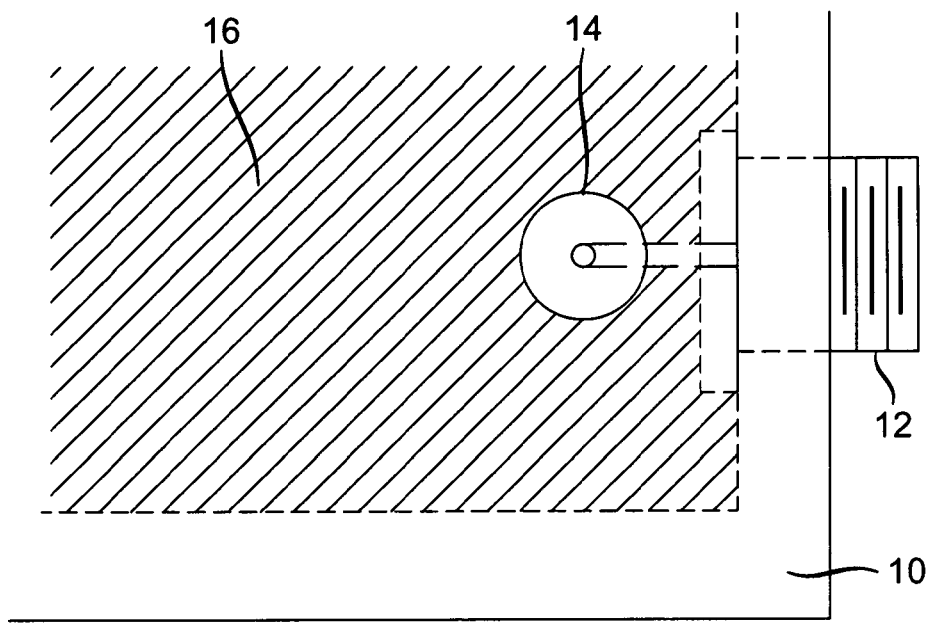
FIG. 1 is a plan view of a printed circuit board (PCB) having an F-connector to which the present invention can be applied.
Figure 2:
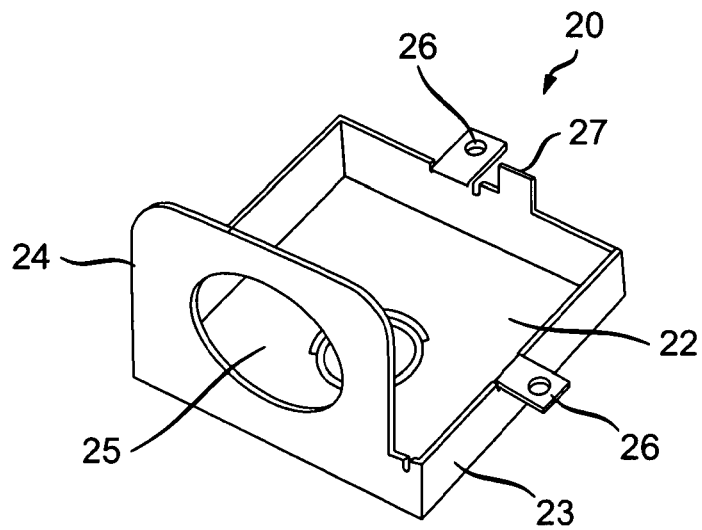
FIG. 2 is a plan view of the RF interference suppressor according to an embodiment of the invention.

The present invention is directed to RF interference suppression in satellite receivers.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

A new satellite receiver system has been introduced employing MOCA (Multimedia of Coax Alliance) in a band of frequencies between 475 and 650 MHz. This allows new functionality by providing two-way communication between two or more satellite receivers in the same household. Such communication provides the exchange of both video signals as well as control functions. Such a system uses the same coaxial cable system as used to distribute the satellite signals from the outdoor unit. This includes signal splitters that divide and weaken the signals, both from the outdoor antenna/converter as well as the signals in the MOCA band among the satellite receivers.

As a result of these new satellite systems and the implementation of MOCA, it becomes very important that potentially interfering signals are not allowed to propagate from the satellite receivers to the system. To this end, any spurious RF energy must not be allowed to enter the coaxial cable system from the individual satellite receivers. The specification from the satellite service provider for this new system employing MOCA is three (3) orders of magnitude lower than previous products. In addition, the satellite receiver has many high level clocks and high speed digital signals that must be isolated from the F-connector that connects to the coaxial cable distribution system. It is also necessary to prevent ingress of signals from external sources such as broadcast television, cell phones, etc.

After conducting some investigation, it has been determined that a great deal of interference is due to an exposed center pin/conductor 14 on the input F-connector 12 on the underside of the PC board (PCB) 10. This is shown in FIG. 1. The bottom of the board 10 can be covered with a grounded copper foil 16 except for the center pin 14 of the F-connector 12.

Figure 3:
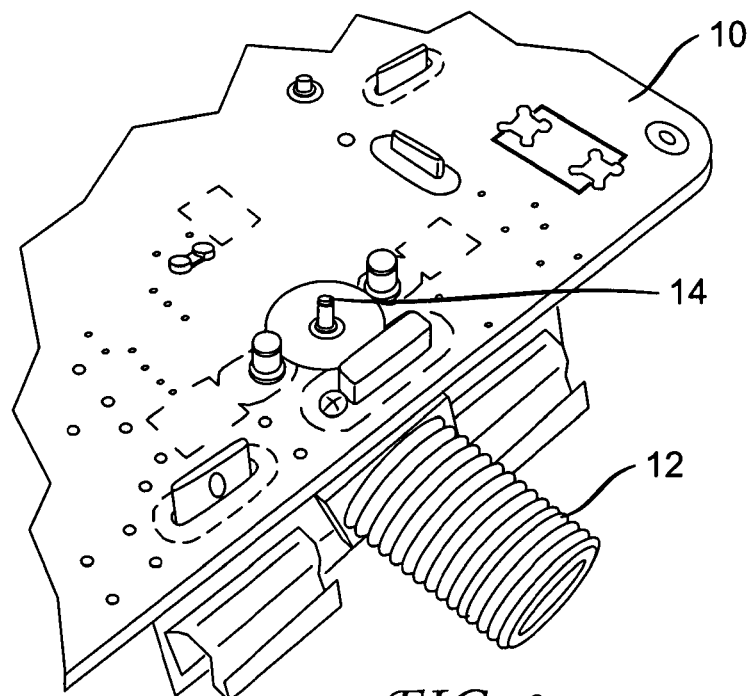
FIG. 3 is a plan view of the underside of a PC board showing the center conductor connection of the F-connector.

As shown in FIG. 3, the construction of the F-connector 12 is such that the center pin 14 must go through the PC board 10 and have a solder connection on the underside thereof. This small point of connection must be shielded to prevent pick-up of spurious signals from the high speed digital portions of the receiver that were generated from the Double Data Rate synchronous dynamic random access memory (DDR) and other components on the bottom side of the PCB 10 and reflected off the inside of the metal enclosure of the satellite receiver and picked up on the center pin 14 of the F-connector 12 that protrudes through the PCB 10.

In addition, a component of the currents from the digital portions of the receiver can be present in the ground plane surrounding the pin 14. Thus the suppressor of the present invention provides a Faraday shield around the center pin to reduce reflected pickup as well as preventing a current differential across the ground plane surrounding the center pin. The Faraday shielding also reduces a source of ingress from outside interference such as broadcast television and cell phones.

In accordance with one embodiment of the invention shown in FIGS. 2, 4 and 5-7, the RF shield 20 includes a metal cover 22 with short sides or sidewalls 23 placed over the center pin connection on the underside of the PC board. This requires connection on all four sides which involves using tabs 26 on three sides (See FIG. 7) including the large metal mounting tab to accommodate the F connector at the edge of the PC board. However, this mounting tab proved to be too large for soldering in the high volume production process, but such a connection proved necessary for proper interference suppression.

Figure 6:
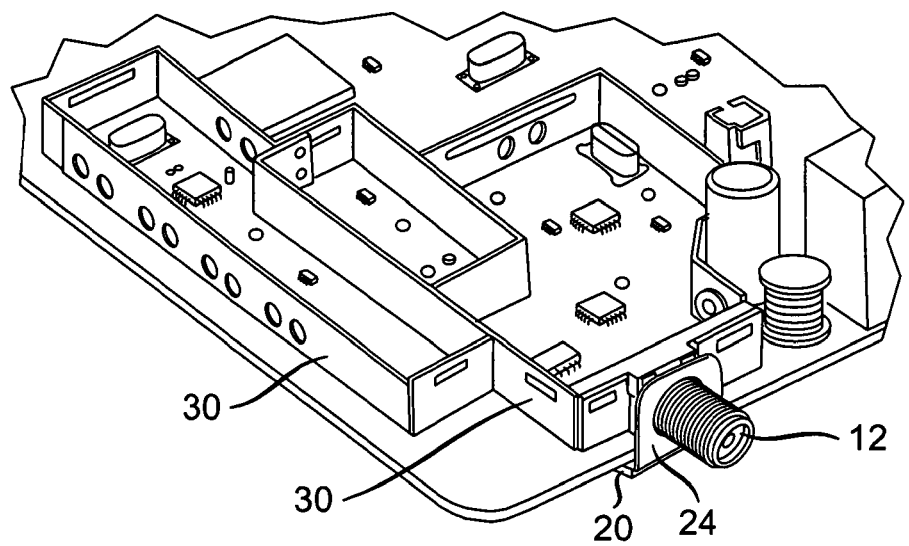
FIG. 6 is a top view of a PC board showing an RF interference suppressor shield surrounding the RF circuitry according to an embodiment of the invention.
Figure 7:
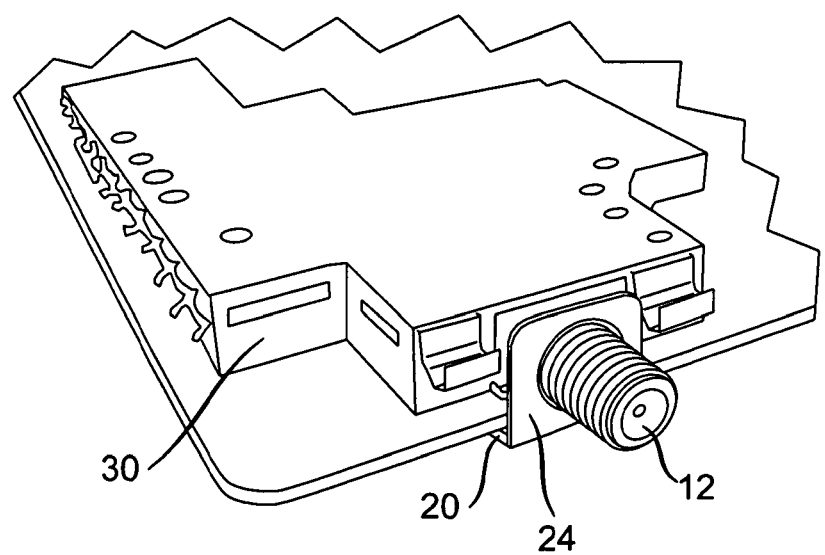
FIG. 7 is a top view of the PC board showing a cover added to the RF interference suppressor shield shown in FIG. 5 according to an embodiment of the invention.

An improved solution, according to an embodiment of the invention, is to extend the metal cover 22 and bend a portion or F-connector tab 24 with an appropriate hole 25 such that it could fit over the threaded part of the F-connector 12. This is shown in FIGS. 2, 4, 6 and 8. It was then determined that this worked even better than the first solution. Upon further investigation, it was found that the gap between the F-connector body 13 and the inner shield wall provided a path for interference. The inner shield 30 is shown in FIGS. 6 and 7, and is generally used to further contain/shield the RF circuit components mounted on the PCB. Suppression requires that not only that the gap be covered, but that a good connection be formed from the F-connector to the inner shield on all sides of the opening. This process extended the coverage of the Faraday shield over the F connector as well as the area surrounding the center pin.

Figure 4:
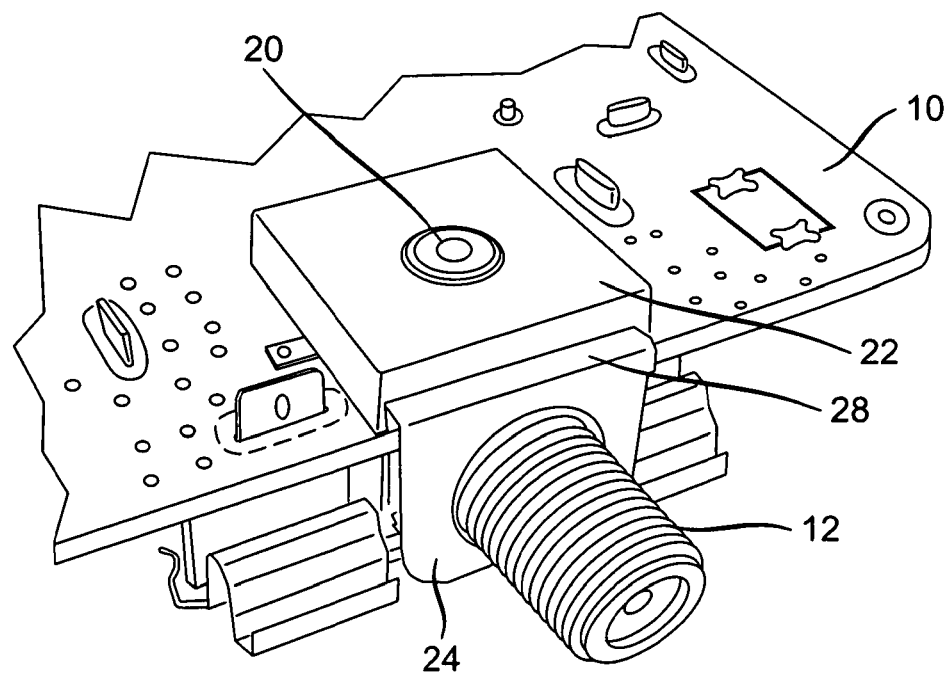
FIG. 4 is an underside view of a PC board showing the RF interference suppressor installed according to an embodiment of the invention.
Figure 5:
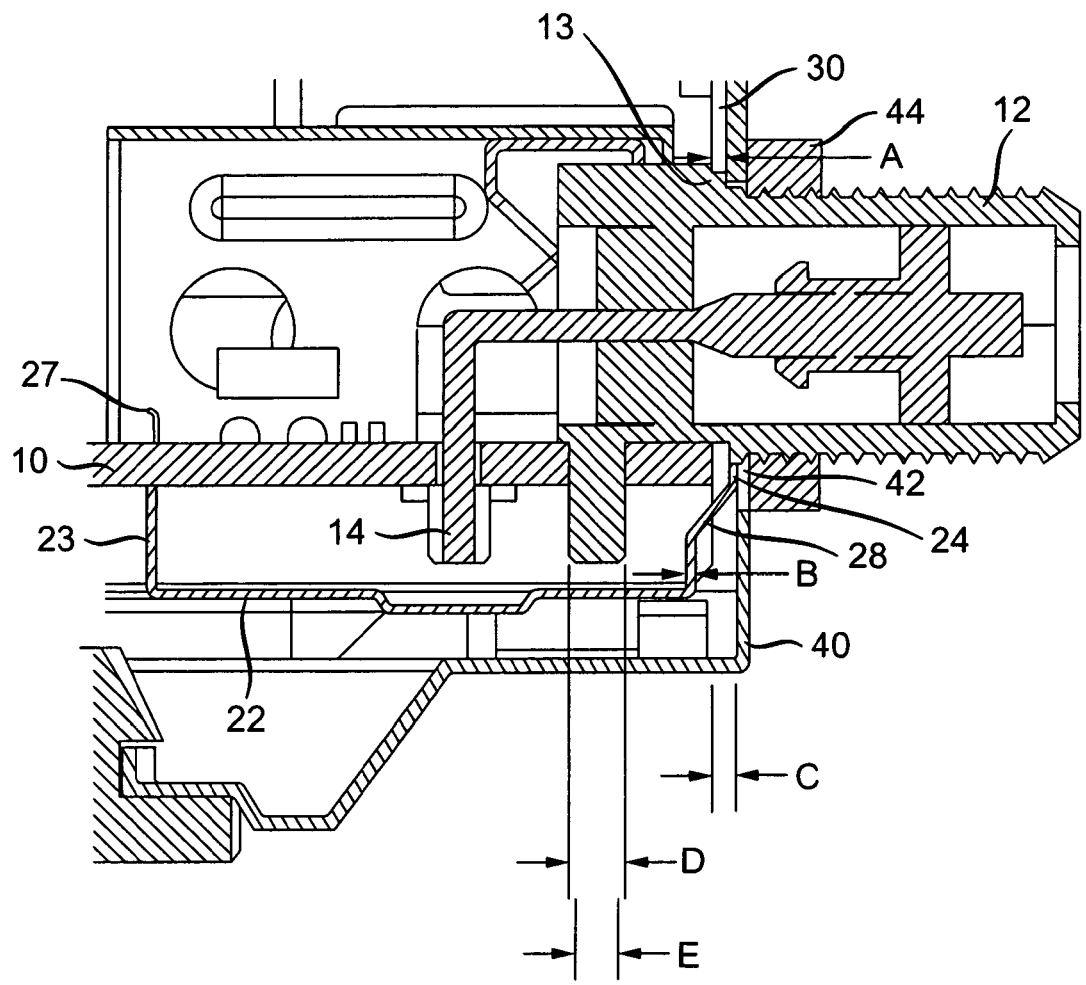
FIG. 5 is cross-sectional view of the RF interference suppressor installed on a PCB according to an embodiment of the invention.

As shown in FIGS. 4 and 5, the hole 25 in portion 24 of RF shield or suppressor 20 is fitted over the F connector 12 and the tabs 26 of the sides 23 are soldered to the bottom of the PC board. The PC board 10 and suppressor assembly is then inserted into the metal case 40 of the satellite receiver with the F connector protruding through a close fitting hole 42 (See FIG. 5). A nut 44 is then put on the F connector 12 and tightened such that the portion 24 of the suppressor is pressed against the inner shield 30, the outer metal case 40 and the F connector body 13. This forms a structure such that any radiated interference is prevented from direct ingress. It also provides a very low impedance connection so that currents flowing in the metal case do not induce interference in the inner shield and associated circuitry connected to the F-connector.

The unique construction and assembly of the metal RF interference suppressor allows the use of a standard F connector, existing designs for the inner shield and metal case, and allows standard factory assembly techniques to be used. The details including provisions for high volume production are shown in FIG. 5.

One difficulty of using existing F connectors is that they rely on a nut 42 on the outside of the case 40 jack panel to be tightened that mechanically cinches up the components of the inner shield, the suppressor shield, the F-connector and case wall to provide a complete seal. The tightening of the F connector nut 42 would impart a large axial force on the bottom and side portions of the shield which would cause the solder tabs 26 to shear from the solder pads on the PC board.

An embodiment of this invention solves this problem with two (2) important features. First, the F-connector tab 24 has an offset 28 that starts just below the bottom edge of the PC board 10. This allows the F-connector tab 24 to bend and be displaced relative to the bottom 22 of the shield. Second, the F connector tab 24 is separated from the side walls 23 of the shield and the side walls of the shield are flush with the edge of the PC board. This prevents the side walls of the shield from being loaded by contact with the inside wall of the case frame or metal case 40, and further allows the tab to be compressed between the inner shield and the outer metal casing when the nut is secured onto the threaded portion of the F-connector on the outside of the metal casing of the satellite receiver.

Another problem solved by the present invention is the securing of the shield 20 in place before and during the solder tabs 26 are soldered. To solve this, the shield design includes a small barbed tab latch 27 that opposes the F connector tab 24 and allows for positive retention within the PC board 10 and therefore consistent and accurate placement. The tab on the F-connector has a thickness of 1.8+ 0.0-0.1 mm which fits into a small PC board slot having the a width of 1.90±0.125 mm, which results in a tight fit.

FIG. 5 shows various gaps A-E which are defined as follows:

A=F-connector shoulder to frame gap which is nominally 0.05 mm;

B=thickness of the shield wall 28, measuring between 0.25 mm, and 0.5 mm;

C=the PC Board edge to the frame gap which is nominally 0.5 mm;

D=the PC Board slot side for mounting the body of the F-connector to the PC Board which is 1.90±0.125 mm; and E=the F-connector body tab size which is 1.8+0.0-0.1 mm, inserted into the slot D.

Figure 8A:
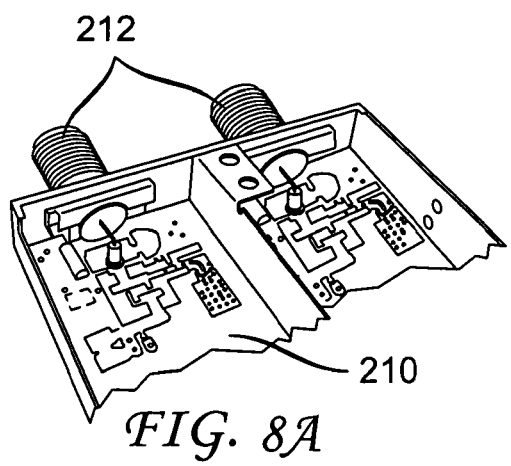
FIGS. 8A and 8B are top and bottom views, respectively, of an exemplary PC board having two F-connectors.
Figure 8B:
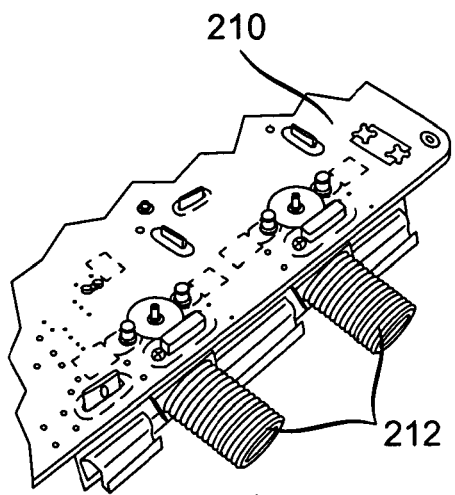
Figure 9A:
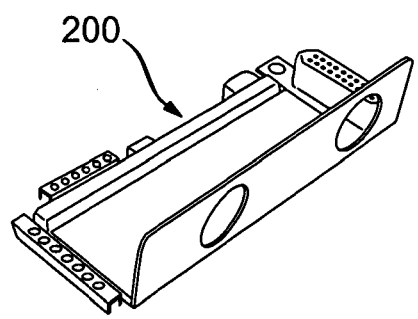
FIGS. 9A and 9B are top and bottom views, respectively, of a dual RF interference suppressor according to an embodiment of the invention.
Figure 9B:
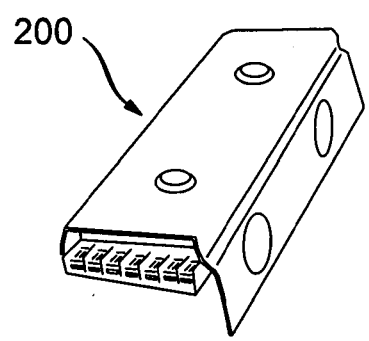
Figure 10A:
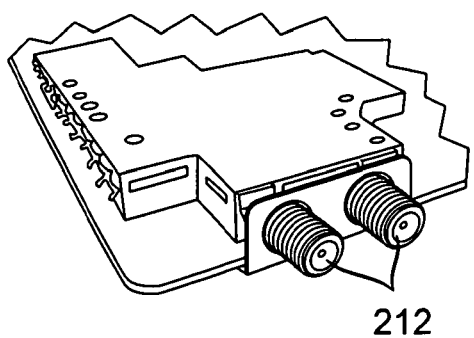
FIGS. 10A and 10B are top and bottom vies of the PC board showing the dual RF interference suppressor installed according to an embodiment of the invention.
Figure 10B:
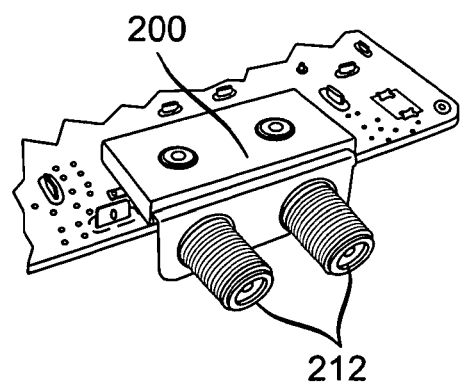

As described in the above exemplary embodiment, the invention can be used on a single F-connector design of the satellite receiver. In accordance with other embodiments, the present invention can be implemented using a single interference suppressor having a plurality of apertures for an electronic device in which multiple side-by-side F connectors 212 are employed. FIGS. 8a and 8b show the top and bottom of a PC Board 210, respectively, having two (2) F-connectors side by side. FIGS. 9a and 9b show the top and bottom of an exemplary single RF interference suppressor 200 having two holes and a length configured to receive and shield the two side by side F-connectors. FIGS. 10a and 10b show the top and bottom views with the single interference suppressor accommodating two side by side F-connectors.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. An assembly comprising:
a satellite receiver having a printed circuit board contained within a metal case and at least one F-connector connected to the printed circuit board and extending out of the metal case; and
an RF interference suppressor having a metal shield configured to be mounted on a side of the printed circuit board so as to enclose a point of connection of a center connector of the at least one F-connector to the PC board, the metal shield comprising:
a bottom;
three sides extending transversely from the bottom wherein each of said three sides further comprises a solder tab extending there from that is soldered to the PC board,
a tab extending upward from the bottom and having an aperture configured to fit around a threaded portion of the at least one F-connector, said tab portion being separated from the three sides such that said tab passes over an edge of the PC board when the aperture is positioned around the F-connector.

2. The assembly of claim 1, wherein the tab further comprises an offset positioned at a base of the tab at a point of a bottom edge of the PC board such that said tab portion is displaced relative to the bottom of the shield.

3. The assembly of claim 1, further comprising positioning means integrated into the shield and configured to secure a position of the shield to the underside of the PC board before soldering.

4. The assembly of claim 3, wherein said positioning means comprises a tab latch positioned on one of said three sides opposing said tab.

5. The assembly of claim 1, wherein said three sides are connected to each other.

6. The assembly of claim 1, wherein said tab is configured to be positioned between a shoulder of the F-connector and the metal case of the satellite receiver.

7. The assembly of claim 1, wherein said tab is sandwiched between the shoulder of the F-connector and the metal case when a nut is secured onto the threaded end of the F-connector from outside the metal case.

8. An RF interference suppressor for a satellite receiver having a printed circuit board contained within a metal case and more than one F-connector connected to the printed circuit board and extending out of the metal case; the RF interference suppressor comprising:
a metal shield configured to be mounted on a side of the printed circuit board so as to enclose each point of connection of a center connector of each of the more than one F-connector to the PC board, comprising:
a bottom;
three sides extending transversely from the bottom, wherein each of said three sides further comprises a solder tab extending there from that is soldered to the PC board,
a tab extending upward from the bottom and having more than one aperture each configured to fit around a threaded portion of each one of the more than one F-connectors, said tab portion being separated from the three sides such that said tab passes over an edge of the PC board when the aperture is positioned around the F-connector.

9. The RF interference suppressor of claim 8, wherein the tab further comprises an offset positioned at a base of the tab at a point of a bottom edge of the PC board such that said tab portion is displaced relative to the bottom of the shield.

10. The RF interference suppressor of claim 8, further comprising positioning means integrated into the shield and configured to secure a position of the shield to the underside of the PC board before soldering.

11. The RF interference suppressor of claim 10, wherein said positioning means comprises a tab latch positioned on one of said three sides opposing said tab.

12. The RF interference suppressor of claim 8, wherein said three sides are connected to each other.

13. The RF interference suppressor of claim 8, wherein said tab is configured to be positioned between a shoulder of each of the more than one F-connectors and the metal case of the satellite receiver.

14. The RF interference suppressor of claim 13, wherein said tab is sandwiched between the shoulder of each one of the F-connectors and the metal case when a nut is secured onto the threaded end of the respective F-connector from outside the metal case.

15. An assembly comprising:
a printed circuit board contained within a metal case having at least one F-connector connected to the printed circuit board that extends out of the metal case; and
an RF interference suppressor having a metal shield configured to be mounted on a side of the printed circuit board so as to enclose a point of connection of a center connector of the at least one F-connector to the PC board, the metal shield comprising:
a bottom;
three sides extending transversely from the bottom wherein each of said three sides further comprises a solder tab extending there from that is soldered to the PC board, a tab extending upward from the bottom and having an aperture configured to fit around a threaded portion of the at least one F-connector, said tab portion being separated from the three sides such that said tab passes over an edge of the PC board when the aperture is positioned around the F-connector.

* * * * *